United States Patent [19]

Wu

[11] Patent Number: 5,710,454
[45] Date of Patent: Jan. 20, 1998

[54] TUNGSTEN SILICIDE POLYCIDE GATE ELECTRODE FORMED THROUGH STACKED AMORPHOUS SILICON (SAS) MULTI-LAYER STRUCTURE.

[75] Inventor: Shye Lin Wu, Hsinchu, Taiwan

[73] Assignee: Vanguard International Semiconductor Corporation, Hsin-Chu, Taiwan

[21] Appl. No.: 638,671

[22] Filed: Apr. 29, 1996

[51] Int. Cl.⁶ .............................. H01L 29/76; H01L 21/44
[52] U.S. Cl. .............................. 257/413; 257/64; 257/74; 257/388; 257/412
[58] Field of Search .......................... 257/64, 74, 388, 257/412, 413; 438/40, 109, 191, 228, 233, 247, 913

[56] References Cited

U.S. PATENT DOCUMENTS

| | | | |
|---|---|---|---|
| 5,327,375 | 7/1994 | Harari | 257/309 |
| 5,347,161 | 9/1994 | Wu et al. | 257/756 |
| 5,350,698 | 9/1994 | Huang et al. | 437/26 |
| 5,393,687 | 2/1995 | Liang | 437/46 |

OTHER PUBLICATIONS

Sl Hsu et al. "Direct Evidence of Gate Oxide Thickness Increase in Tungsten Polycide Processes" IEEE Electron device Letters, vol. 12, No. 11, Nov. 1991, pp. 623–625.

H. Hayashida et al. "Dopant Redistribution in Dual Gate W-Polycide CMOS and its Improvements by RTA", 1989 VLSI SympTech Digest, pp. 29–30 no month.

H. Yen et al. "Thermal Treatment and Underlayer Effects on Silane and Dichlorosilane Based Tungsten Silicide for Deep Submicron Interconnection Processes" no month 1995 VLSI Technology, Systems & Applications pp. 176–179.

CV Thompson, "Gain Growth in Polycrystalline Silicon Films", Mat. Res. Soc. Symp Proc. vol. 106 (1988) pp. 115–125 no month.

S.L. Wu et al., "High Performance Polysilicon Contacted Shallow Junctions Formed by stacked-Amorphous-Silicon-Films" IEEE Electron Device Letters, vol. 13, No. 1 (Jan. 1992) pp. 23–25.

S.L. Wu et al, "Characteristics of Polysilicon Contacted Shallow Junction Diode Formed with a Stacked-Amorphous-Silicon-Film" IEEE Trans on Electron Dev. vol. 40, No. 10 (Oct. 1993). pp. 1797–1803.

SL Wu et al, "Suppression of Boron Penetration into an Ultra-Thin Gate Oxide ($\leq 7nm$) by using a Stacked-Amorphous-Silicon(SAS) Film" IEDM '96, pp. 329–332.

*Primary Examiner*—Edward Wojciechowicz
*Attorney, Agent, or Firm*—George O. Saile; Stephen B. Ackerman; Alek P. Szecsy

[57] ABSTRACT

A method for forming a tungsten silicide polycide gate electrode within a Metal Oxide Semiconductor Field Effect Transistor (MOSFET), and the tungsten silicide polycide gate electrode which is formed through the method. Formed upon a semiconductor substrate is a gate oxide layer. Formed upon the gate oxide layer is a first polysilicon layer which is formed through annealing a first amorphous silicon layer. Formed upon the first polysilicon layer is a second polysilicon layer which is formed through annealing a second amorphous silicon layer. Formed upon the second polysilicon layer is a tungsten silicide layer formed through a Chemical Vapor Deposition (CVD) method. The first polysilicon layer and the second polysilicon layer have a crystallite size no greater than about 0.3 microns, and the first polysilicon layer and the second polysilicon layer have a dopant concentration larger than about 1E16 atoms per cubic centimeter. Optionally, at least a third polysilicon layer may be added through annealing at least a third amorphous silicon layer between the second polysilicon layer and the tungsten silicide layer. Optionally, an fourth amorphous silicon layer may be added directly beneath the tungsten silicide layer.

22 Claims, 4 Drawing Sheets

TUNGSTEN SILICIDE POLYCIDE GATE ELECTRODE FORMED THROUGH STACKED AMORPHOUS SILICON (SAS) MULTI-LAYER STRUCTURE.

BACKGROUND OF THE INVENTION

1. Field of the Invention

The present invention relates generally to gate electrodes formed within Metal Oxide Semiconductor Field Effect Transistors (MOSFETs). More particularly, the present invention relates to tungsten silicide polycide gate electrodes formed through Stacked Amorphous Silicon (SAS) multi-layer structures within Metal Oxide Semiconductor Field Effect Transistors (MOSFETs).

2. Description of the Related Art

As integrated circuit device dimensions have become smaller, it has become increasingly important to assure that functional and reliable connections between integrated circuit devices and conductor elements within integrated circuits may be readily and efficiently made. Within integrated circuits within which there are formed Metal Oxide Semiconductor Field Effect Transistors (MOSFETs), such functional and reliable connections between conductor elements and gate electrodes of those Metal Oxide Semiconductor Field Effect Transistors (MOSFETs) are often made through polycide gate electrodes. Commonly, the polycide gate electrode is a tungsten silicide polycide gate electrode formed of a tungsten silicide upper layer residing upon a polysilicon lower layer which in turn resides upon the Metal Oxide Semiconductor Field Effect Transistor (MOSFET) gate oxide layer.

Although tungsten silicide polycide gate electrodes within Metal Oxide Semiconductor Field Effect Transistors (MOSFETs) provide superior surfaces onto which contact with conductor elements may be made, tungsten silicide polycide gate electrodes are not without problems. In particular, tungsten silicide polycide gate electrodes suffer from problems including but not limited to: (1) excess fluorine migration (from tungsten hexafluoride starting material when employing a Chemical Vapor Deposited (CVD) tungsten silicide layer) from the tungsten silicide layer to the polysilicon layer/gate oxide layer interface under high temperature annealing, thus increasing the gate oxide layer thickness (see, for example, S. L. Hsu et al., "Direct Evidence of Gate Oxide Thickness Increase in Tungsten Polycide Processes," IEEE Electron Device Lett., Vol. 12, No. 11 (November 1991) pp. 623–25, the teachings of which are incorporated herein fully by reference); (2) redistribution of dopants from within the polysilicon layer upon thermal processing of the tungsten silicide polycide gate electrode, (see, for example, H. Hayashida et al., "Dopant Redistribution in Dual Gate W-Polycide CMOS and its Improvement by RTA," 1989 VLSI Symp Tech. Digest, pp. 29–30, the teachings of which are incorporated herein fully by reference); and (3) high resistivities of tungsten silicide layers formed upon large grain sized polysilicon layers for advanced interconnections (see, for example, H. Yen et al., "Thermal Treatment and Underlayer Effects on Silane and Dichlorosilane Based Tungsten Silicide for Deep Sub-Micron Interconnection Processes," 1995 VLSI Technology, Systems and Applications, pp. 176–79, the teachings of which are incorporated herein fully by reference). It is towards the goal of forming within Metal Oxide Semiconductor Field Effect Transistors (MOSFETs) tungsten silicide polycide gate electrodes with limited susceptibility to the foregoing problems that the present invention is directed.

The grain growth characteristics of polysilicon films which may be employed in forming tungsten silicide polycide gate electrodes have in general been disclosed in the art by C. V. Thompson in "Grain Growth in Polycrystalline Silicon Films," Mat. Res. Soc. Symp. Proc., Vol. 106 (1988), pp. 115–125. In addition, a method for forming buried contacts within integrated circuits through use of multiple polysilicon films with mis-matched crystal properties has been disclosed by Liang in U.S. Pat. No. 5,393,687. Further, Huang et al., in U.S. Pat. No. 5,350,698 disclose a method for forming a gate electrode from multiple polysilicon layers, or preferably, multiple amorphous silicon layers which are subsequently annealed to form polysilicon layers, along with intervening silicon oxide layers and an optional terminal tungsten silicide layer to limit the channeling of ion implants observed through single polysilicon layers of equivalent thickness. Multiple amorphous silicon layers are preferred since upon annealing they form a larger grain size than otherwise equivalent multiple polysilicon layers.

As an alternative to methods which employ either multiple polysilicon layers or multiple amorphous silicon layers interspersed with silicon oxide layers, there has also been disclosed in the art the use of Stacked Amorphous Silicon (SAS) multi-layer structures without interspersed silicon oxide layers, which Stacked Amorphous Silicon (SAS) multi-layer structures when annealed to form corresponding polysilicon layers improve the performance of integrated circuit devices. For example, S. L. Wu et al., have disclosed the use of Stacked Amorphous Silicon (SAS) multi-layer structures in forming high performance polysilicon contacted shallow junction diodes. See, S. L. Wu et al., "High-Performance Polysilicon Contacted Shallow Junctions Formed by Stacked-Amorphous-Silicon Films," IEEE Electron Device Lett., Vol. 13, No. 1 (January 1992), pp. 23–25; S. L. Wu et al., "Characteristics of Polysilicon Contacted Shallow Junction Diode Formed with a Stacked-Amorphous-Silicon Film," IEEE Transactions on Electron Devices, Vol. 40, No. 10 (October 1993), pp. 1797–1803; Wu et al., U.S. Pat. No. 5,347,161.

In addition to their application in forming high performance polysilicon contacted shallow junction diodes, the use of Stacked Amorphous Silicon (SAS) multi-layer structures, when annealed, has also been disclosed in suppressing boron penetration from polysilicon gate electrodes into underlying ultra-thin gate oxides within p-Metal Oxide Semiconductor Field Effect Transistors (pMOSFETs). See, S. L. Wu, "Suppression of Boron Penetration into an Ultra-Thin Gate Oxide ($\leq 7$ nm) by Using a Stacked-Amorphous-Silicon (SAS) Film," IEDM 93, pp. 329–32.

Desirable in the art are methods and structures through which the superior barrier properties of polysilicon layers formed through annealing Stacked Amorphous Silicon (SAS) multi-layer structures may be employed in forming within Metal Oxide Semiconductor Field Effect Transistors (MOSFETs) tungsten silicide polycide gate electrodes which simultaneously provide superior fluorine diffusion barrier properties, superior dopant retention properties and superior (ie: lower) contact resistance properties. It is towards the foregoing goals that the present invention is directed.

SUMMARY OF THE INVENTION

A first object of the present invention is to provide a tungsten silicide polycide gate electrode within a Metal Oxide Semiconductor Field Effect Transistor (MOSFET), and a method for forming the tungsten silicide polycide gate electrode within the Metal Oxide Semiconductor Field Effect Transistor (MOSFET), which tungsten silicide polycide gate electrode suppresses diffusion of excess fluorine from a Chemical Vapor Deposited (CVD) tungsten silicide layer which forms the uppermost layer of the tungsten silicide polycide gate electrode.

A second object of the present invention is to provide a tungsten silicide polycide gate electrode and a method of forming the tungsten silicide polycide gate electrode in accord with the first object of the present invention, which tungsten silicide polycide gate electrode also limits redistribution of dopants from within the polysilicon layer of the tungsten silicide polycide gate electrode.

A third object of the present invention is to provide a tungsten silicide polycide gate electrode and a method of forming the tungsten silicide polycide gate electrode in accord with the first object of the present invention and the second object of the present invention, which tungsten silicide polycide gate electrode provides low contact resistance of electrical connections through the tungsten silicide layer which forms the uppermost layer of the tungsten silicide polycide gate electrode.

In accord with the objects of the present invention, there is provided a tungsten silicide polycide gate electrode for use within a Metal Oxide Semiconductor Field Effect Transistor (MOSFET), as well as a method by which that tungsten silicide polycide gate electrode may be formed. To form the tungsten silicide polycide gate electrode of the present invention there is first formed upon a semiconductor substrate a gate oxide layer. Formed upon the gate oxide layer is a first polysilicon layer formed through annealing a first amorphous silicon layer. Formed upon the first polysilicon layer is a second polysilicon formed through annealing a second amorphous silicon layer. Formed upon the second polysilicon layer is a tungsten silicide layer formed through a Chemical Vapor Deposition method. The first polysilicon layer and the second polysilicon layer have a crystallite size of no greater than about 0.3 microns, and the first polysilicon layer and the second polysilicon layer have a dopant concentration of larger than about 1E16 atoms per cubic centimeter.

The method of the present invention provides a tungsten silicide polycide gate electrode within a Metal Oxide Semiconductor Field Effect Transistor (MOSFET), which tungsten silicide polycide gate electrode suppresses diffusion of excess fluorine from a Chemical Vapor Deposited (CVD) tungsten silicide layer which forms the uppermost layer of the tungsten silicide polycide gate electrode. Although the mechanism by which fluorine diffuses through the polysilicon layers of the tungsten silicide polycide gate electrode of the present invention is not entirely well understood, it is nonetheless clear that the polysilicon layers of the tungsten silicide polycide electrode, when formed through thermal annealing of a Stacked Amorphous Silicon (SAS) multilayer structure, provides several interfacial barriers which inhibit the diffusion of fluorine from the tungsten silicide layer of the tungsten silicide polycide gate electrode to the polysilicon layer/gate oxide layer interface, thus limiting increases in gate oxide thickness.

The method of the present invention provides a tungsten silicide polycide gate electrode which also limits redistribution of dopants within the polysilicon layers of the tungsten silicide polycide gate electrode. Analogously with the mechanism through which the polysilicon layers formed through annealing the Stacked Amorphous Silicon (SAS) multi-layer structure of the tungsten silicide polycide gate electrode of the present invention inhibit diffusion of excess fluorine downward from tungsten silicide layer of the tungsten silicide polycide gate electrode, the polysilicon layers also inhibit diffusion of dopants from within the polysilicon layers either upward to the tungsten silicide layer or downward through the gate oxide layer of the Metal Oxide Semiconductor Field Effect Transistor (MOSFET) within which is formed the tungsten silicide polycide gate electrode.

The method of the present invention provides a tungsten silicide polycide gate electrode which provides low contact resistance electrical connections through the tungsten silicide layer which forms the uppermost layer of the tungsten silicide polycide gate electrode. Although the mechanism by which morphology of underlying polysilicon layers affects the resistance of electrical connections formed upon the tungsten silicide polycide gate electrode of the present invention is not entirely well understood, it is nonetheless clear that contact resistance of electrical connections made to tungsten silicide layers formed upon smaller crystallite sized polysilicon layers having a crystallite size no greater than about 0.3 microns formed through the Stacked Amorphous Silicon (SAS) multi-layer structure of the present invention are lower than the contact resistance of electrical connections made to larger crystallite sized polysilicon layers which are formed through methods employing other than the Stacked Amorphous Silicon (SAS) multi-layer structure of the present invention.

BRIEF DESCRIPTION OF THE DRAWINGS

The objects, features and advantages of the present invention are understood within the context of the description set forth below. The description is understood in conjunction with the accompanying drawings, which form a material part of this disclosure, wherein.

DESCRIPTION OF THE PREFERRED EMBODIMENTS

Figure 1:
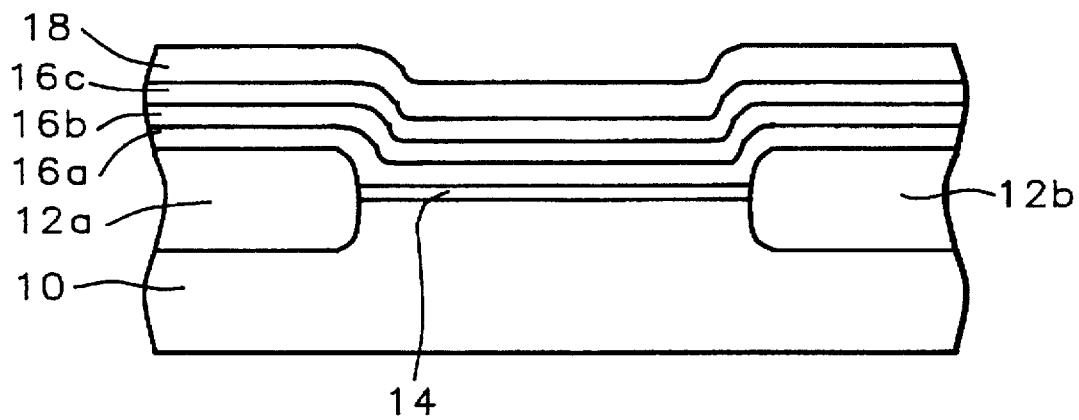
FIG. 1 to FIG. 3 show a series of schematic cross-sectional diagrams illustrating the results of progressive stages in forming a tungsten silicide polycide gate electrode through the preferred embodiments of the method of the present invention within an integrated circuit.

The present invention provides a tungsten silicide polycide gate electrode for use within a Metal Oxide Semiconductor Field Effect Transistor (MOSFET) within an integrated circuit, and a method for forming that tungsten silicide polycide gate electrode. The tungsten silicide polycide gate electrode of the present invention simultaneously provides superior fluorine diffusion barrier properties, superior dopant retention properties and superior (ie: lower) contact resistance properties. The present invention provides a tungsten silicide polycide gate electrode having these properties through forming the polysilicon layers of the tungsten silicide polycide gate electrode from annealing of a Stacked Amorphous Silicon (SAS) multi-layer structure. The Stacked Amorphous Silicon (SAS) multi-layer structure is annealed to form polysilicon layers with a crystallite size of no greater than about 0.3 microns. Optionally, there may be provided an amorphous silicon layer upon the surface of the polysilicon layers of crystallite size no greater than about 0.3 microns which are formed through annealing of the Stacked Amorphous Silicon (SAS) multi-layer structure. Although the mechanism through which fluorine and dopants thermally diffuse through or from the polysilicon layers of the tungsten silicide polycide gate electrode of the present invention is not entirely well understood, it is nonetheless clear that: (1) diffusion of excess fluorine from the uppermost tungsten silicide layer of the tungsten silicide polycide gate electrode to the polysilicon layer/gate oxide layer interface, and (2) diffusion of dopants from within the polysilicon layers to either the tungsten silicide layer or through the gate oxide layer is inhibited at the interfaces of the polysilicon layers of the tungsten silicide polycide gate electrode of the present invention. Finally, since both: (1) the polysilicon layers which are formed through annealing the Stacked Amorphous Silicon (SAS) multi-layer structure, and (2) the optional amorphous silicon layer have a smaller crystallite size than the crystallite size of polysilicon layers formed through conventional methods, the tungsten silicide layer of the tungsten silicide polycide gate electrode of the present invention has a lower contact resistance than an otherwise equivalent tungsten silicide layer formed upon a polysilicon layer of larger crystallite size formed through a conventional method.

The method of the present invention may be employed in forming tungsten silicide polycide gate electrodes within various types of integrated circuits which have formed therein transistors which employ gate electrodes, such as, but not limited to Metal Oxide Semiconductor Field Effect Transistors (MOSFETs) and Bipolar Complementary Metal Oxide Semiconductor (BiCMOS) transistors. The method of the present invention may be employed in forming tungsten silicide polycide gate electrodes within integrated circuits including but not limited to Dynamic Random Access Memory (DRAM) integrated circuits, Static Random Access Memory (SRAM) integrated circuits, Flash Electrically Erasable Programmable Read Only Memories (Flash E2PROM) integrated circuits, logic integrated circuits and Application Specific Integrated Circuits (ASICs). The method of the present invention has broad applicability in forming within appropriate integrated circuits tungsten silicide polycide gate electrodes.

Figure 2:
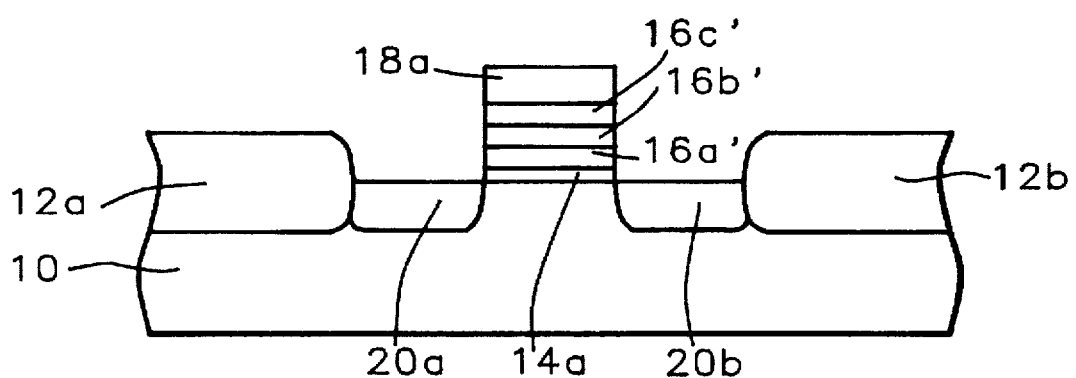
Figure 3:
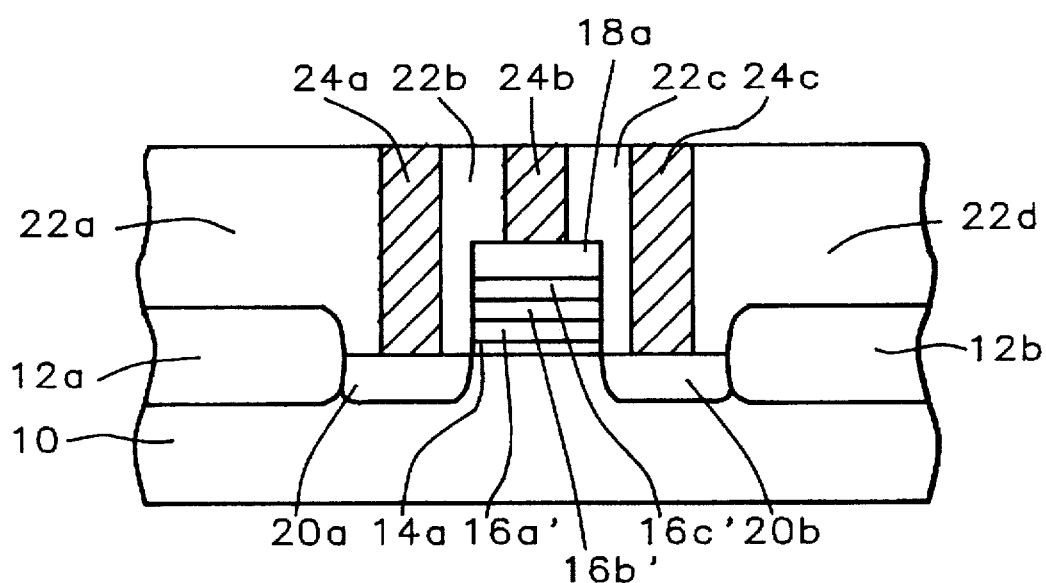

Referring now to FIG. 1 to FIG. 3 there is shown a series of schematic cross-sectional diagrams illustrating the results of progressive process stages in forming within a Metal Oxide Semiconductor Field Effect Transistor (MOSFET) within an integrated circuit a tungsten silicide polycide gate electrode in accord with the preferred embodiments of the method of the present invention. Shown in FIG. 1 is a schematic cross-sectional diagram of the integrated circuit at its early stages of fabrication.

Shown in FIG. 1 is a semiconductor substrate 10 upon and within whose surface there are formed isolation regions 12a and 12b. Semiconductor substrates upon which the present invention may be practiced may be formed with either dopant polarity, many dopant concentrations and any crystallographic orientation. Typically, the semiconductor substrate 10 upon which is practiced the method of the present invention is a N— or P— silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate oxidation mask is oxidized to form isolation regions within and upon the semiconductor substrate, and methods whereby a separate insulator layer is formed upon a semiconductor substrate and subsequently patterned to form isolation regions upon the semiconductor substrate. For the preferred embodiment of the method of the present invention, the isolation regions 12a and 12b are preferably formed through a thermal oxidation method whereby portions of the semiconductor substrate 10 exposed through an oxidation mask are consumed to form within and upon the semiconductor substrate 10 isolation regions 12a and 12b of silicon oxide.

Also illustrated within FIG. 1 is a blanket gate oxide layer 14 which is formed upon the surface of the active semiconductor region of semiconductor substrate 10 defined by the isolation regions 12a and 12b. Methods and materials through which blanket gate oxide layers may be formed upon active semiconductor regions of semiconductor substrates are known in the art. Blanket gate oxide layers may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region.

For the preferred embodiment of the method of the present invention, the blanket gate oxide layer 14 is preferably formed through thermal oxidation of the active semiconductor region of semiconductor substrate 10 at a temperature of about 700 to about 1100 degrees centigrade to yield a typical blanket gate oxide layer 14 thickness of about 30 to about 200 angstroms.

Also shown in FIG. 1 are three blanket polysilicon layers 16a, 16b and 16c which are formed upon the blanket gate oxide layer 14 and the isolation regions 12a and 12b. It is from the three blanket polysilicon layers 16a, 16b and 16c that the polysilicon layers of the tungsten silicide polycide gate electrode of the present invention are formed. Methods and materials through which blanket polysilicon layers may be formed within integrated circuits are known are in general known in the art. However, in order to provide the desired properties to the tungsten silicide polycide gate electrode of the present invention, the three blanket polysilicon layers 16a, 16b and 16c are preferably formed through annealing three corresponding blanket amorphous silicon layers which form a Stacked Amorphous Silicon (SAS) multi-layer structure. Methods and materials through which blanket amorphous silicon layers may be formed within integrated circuits are known in the art. Such methods include but are not limited to Chemical Vapor Deposition (CVD) methods, Low Pressure Chemical Vapor Deposition (LPCVD) methods and Physical Vapor Deposition (PVD) sputtering methods through which may be deposited blanket amorphous silicon layers from silicon source materials including but not limited to silane, dichlorosilane and silicon targets, as appropriate.

Although an alternative ordering of process steps will yield a functionally equivalent structure, for the preferred embodiment of the method of the present invention, the three blanket polysilicon layers 16a, 16b and 16c are preferably formed through sequential annealing of the corresponding blanket amorphous silicon layers. The annealing of the corresponding blanket amorphous silicon layers to form the blanket polysilicon layers 16a, 16b and 16c may alternatively, however, be undertaken in one process step.

Preferably, each individual blanket amorphous silicon layer and the corresponding blanket polysilicon layers 16a, 16b or 16c are formed upon the blanket gate oxide layer 14 and the isolation regions 12a and 12b preferably at a thickness of greater than about 200 angstroms. Most preferably, each individual blanket amorphous silicon layer and the corresponding blanket polysilicon layers 16a, 16b or 16c are formed upon the blanket gate oxide layer 14 and the isolation regions 12a and 12b at a thickness of from about 200 to about 2000 angstroms. Preferably, although not exclusively, the blanket amorphous silicon layers are formed employing silane as a silicon source material through a Low Pressure Chemical Vapor Deposition (LPCVD) method at a deposition temperature of from about 400 to about 600 degrees centigrade and a deposition pressure of from about 50 to about 300 mtorr.

Subsequent to forming each blanket amorphous silicon layer, each blanket amorphous silicon layer is preferably annealed in an inert atmosphere at a temperature of from about 700 to about 950 degrees centigrade for a time period of from about 10 to about 100 minutes to form the corresponding blanket polysilicon layers 16a, 16b and 16c. Preferably, the inert atmosphere is a high purity nitrogen inert atmosphere at a pressure of from about 200 to about 760 mtorr, although other inert atmospheres, such as, but not limited to argon inert atmospheres may also be employed. The annealing of the present invention under an inert atmosphere at a temperature of from about 700 to about 950 degrees centigrade and a pressure of from about 200 to about 760 mtorr transforms each of the blanket amorphous silicon layers into a corresponding blanket polysilicon layer 16a, 16b or 16c of crystallite size no greater than about 0.3 microns. For comparison, the typical crystallite size of polysilicon layers deposited directly within integrated circuits through conventional methods absent annealing of an intervening amorphous silicon layer is typically substantially greater than the crystallite size of polysilicon layers formed through annealing intervening amorphous silicon layers, although the crystallite size of polysilicon layers deposited directly within integrated circuits is typically from about 0.1 to about 0.3 microns.

Although not illustrated in FIG. 1, it is optional within the preferred embodiment of the method of the present invention to form a fourth blanket amorphous silicon layer as an additional layer upon the blanket polysilicon layer 16c and immediately below a subsequently formed blanket tungsten silicide layer. Such a fourth blanket amorphous silicon layer, if formed, is preferably formed through methods and materials equivalent to the methods and materials through which are formed the three blanket amorphous silicon layers which are annealed to form the blanket polysilicon layers 16a, 16b and 16c, however, the fourth blanket amorphous silicon layer is not annealed. Preferably, the fourth blanket amorphous silicon layer has a thickness of from about 200 to about 2000 angstroms. Such a fourth blanket amorphous silicon layer provides an exceedingly smooth surface upon which may subsequently be formed a tungsten silicide layer.

Although also not illustrated within FIG. 1, a greater or lesser number of blanket polysilicon layers than the three blanket polysilicon layers 16a, 16b and 16c may be employed in forming the tungsten silicide polycide gate electrode through the method of the present invention. At minimum, two blanket polysilicon layers are required in forming the tungsten silicide polycide gate electrode of the present invention. A greater number of blanket polysilicon layers may be employed, the number typically being limited by the height desired for the tungsten silicide polycide gate electrode of the present invention and the minimal thickness with which blanket polysilicon layers may be formed through the preferred embodiment of the method of the present invention. Typically, and preferably, the tungsten silicide polycide gate electrode of the present invention will have about three blanket polysilicon layers analogous to the three blanket polysilicon layers 16a, 16b and 16c illustrated in FIG. 1.

In order to ultimately provide an operational tungsten silicide polycide gate electrode, each of the blanket polysilicon layers 16a, 16b and 16c, as well as any additional blanket polysilicon layers and the optional fourth blanket amorphous silicon layer must be adequately conductive, preferably through incorporation of dopant atoms into: (1) the blanket polysilicon layers 16a, 16b and 16c; (2) any additional blanket polysilicon layers; and (3) the optional fourth blanket amorphous silicon layer. The dopant atoms may be incorporated into these blanket layers through methods as are conventional in the art, including but not limited to Chemical Vapor Deposition (CVD) co-deposition methods and ion implantation methods undertaken at appropriate process steps. The polarity of the Metal Oxide Semiconductor Field Effect Transistor (MOSFET) into which is formed the tungsten silicide polycide gate electrode of the present invention will typically dictate the polarity of dopant employed within: (1) the blanket polysilicon layers 16a, 16b and 16c; (2) any additional blanket polysilicon layers; and (3) the optional fourth blanket amorphous silicon layer. Common dopants include but are not limited to arsenic dopants, boron dopants and phosphorus dopants. For the preferred embodiment of the method of the present invention, the blanket polysilicon layers 16a, 16b and 16c, as well as any additional blanket polysilicon layers and the optional fourth blanket amorphous silicon layer are preferably made conductive through incorporation of a suitable dopant at a concentration of larger than about 1E16 atoms per cubic centimeter.

Finally, there is shown in FIG. 1 the presence of a blanket tungsten silicide layer 18 formed upon the surface of the blanket polysilicon layer 16c. Methods and materials through which blanket tungsten silicide layers may be formed within integrated circuits are known in the art. Although blanket tungsten silicide layers may be formed through several methods and materials, the method of the present invention provides most value in limiting diffusion of excess fluorine from a tungsten silicide layer within a tungsten silicide polycide gate electrode when the tungsten silicide layer is formed through a Chemical Vapor Deposition (CVD) method which employs tungsten hexafluoride as a tungsten source material. Although tungsten hexafluoride may be employed in forming a tungsten silicide layer within a tungsten silicide polycide gate electrode through an intermediate tungsten metal layer, preferably, the blanket tungsten silicide layer 18 is formed through a Chemical Vapor Deposition (CVD) co-deposition method employing tungsten hexafluoride and a suitable silicon source material, such as, but not limited to, silane and dichlorosilane silicon source materials. Preferably, the thickness of the blanket tungsten silicide layer 18 is from about 100 to about 2000 angstroms.

It is preferred within the preferred embodiment of the method of the present invention that the blanket polysilicon layer 16c, or the optional fourth blanket amorphous silicon layer formed upon the blanket polysilicon layer 16c, not be allowed to form a native oxide. Thus, it is preferred that subsequent to forming the blanket polysilicon layer 16c, or the optional fourth blanket amorphous silicon layer, the semiconductor substrate 10 not be exposed to an oxygen containing atmosphere, such as an ambient atmosphere. Preferably, the semiconductor substrate 10 having formed thereupon the blanket polysilicon layer 16c, or the optional fourth blanket amorphous silicon layer, is preferably maintained in an inert atmosphere after forming the blanket polysilicon layer 16c or the optional fourth blanket amorphous silicon layer upon the blanket polysilicon layer 16c. Alternatively, the semiconductor substrate 10 is preferably processed within a cluster tool where ambient atmosphere is readily excluded.

Referring now to FIG. 2, there is shown a schematic cross-sectional diagram illustrating the results of further processing of the integrated circuit whose schematic cross-sectional diagram is illustrated in FIG. 1. Shown in FIG. 2 is the tungsten silicide polycide gate electrode which is formed through patterning of the blanket polysilicon layers 16a, 16b and 16c and the blanket tungsten silicide layer 18. The tungsten silicide polycide gate electrode is formed from the patterned tungsten silicide layer 18a, beneath which resides the patterned polysilicon layers 16c', 16b' and 16a'. The methods and materials through which the tungsten silicide polycide gate electrode is patterned from the blanket tungsten silicide layer 18 and the blanket polysilicon layers 16a, 16b and 16c, are conventional to the art. Typically, although not exclusively, the methods will involve Reactive Ion Etch (RIE) etch methods employing reactant gases appropriate to the blanket tungsten silicide layer 18 and the blanket polysilicon layers 16a, 16b and 16c. As illustrated within FIG. 2, the blanket gate oxide layer 14 is also preferably subsequently patterned to yield the patterned gate oxide layer 14a.

Also shown in FIG. 2 is the presence of the source/drain electrodes 20a and 20b formed within the surface of the active semiconductor region of the semiconductor substrate 10 at areas not occupied by the tungsten silicide polycide gate electrode and the patterned gate oxide layer 14a. Methods and materials through which source/drain electrodes may be formed within semiconductor substrates are known in the art. Such methods and materials typically employ dopant species which are ionized and implanted into a semiconductor substrate at sufficient velocity and dose to form into the semiconductor substrate a region of conductivity sufficient for a source/drain electrode. The polarity desired for the source/drain electrode will dictate the polarity of the dopant species. Dopant species including but not limited to arsenic dopant species, boron dopant species and phosphorus dopant species are common in the art. For the preferred embodiment of the method of the present invention, the source/drain electrodes 20a and 20b are preferably formed through implanting a suitable dopant species into the active region of the semiconductor substrate 10 at about 1E13 to about 5E16 ions per square centimeter dose and about 10 to about 180 keV ion implantation energy.

Referring now to FIG. 3 there is shown a schematic cross-sectional diagram illustrating the results of further processing of the integrated circuit whose schematic cross-sectional diagram is illustrated in FIG. 2. Shown in FIG. 3 is the presence of a series of patterned planarized Pre-Metal Dielectric (PMD) layers 22a, 22b, 22c and 22d, formed upon the surface of the integrated circuit whose structure is illustrated in FIG. 2.

Methods and materials through which patterned Pre-Metal Dielectric (PMD) layers may be formed within integrated circuits are known in the art. Patterned Pre-Metal Dielectric (PMD) layers are typically, although not exclusively, formed through patterning and planarizing through methods as are known in the art of blanket conformal Pre-Metal Dielectric (PMD) layers. Blanket conformal Pre-Metal Dielectric (PMD) layers may be formed through methods including but not limited to Chemical Vapor Deposition (CVD) methods, Plasma Enhanced Chemical Vapor Deposition (PECVD) methods and Physical Vapor Deposition (PVD) sputtering methods through which may be formed blanket conformal dielectric layers of dielectric materials including but not limited to silicon oxide dielectric materials, silicon nitride dielectric materials and silicon oxynitride dielectric materials. The blanket conformal Pre-Metal Dielectric (PMD) layers so formed may then be planarized through planarizing methods as are known in the art, including but not limited to Chemical Mechanical Polish (CMP) planarizing methods and Reactive Ion Etch (RIE) etchback planarizing methods. Finally, the blanket conformal Pre-Metal Dielectric (PMD) layers so planarized may then be patterned, typically, although not exclusively, through Reactive Ion Etch (RIE) patterning methods as are known in the art.

For the preferred embodiment of the method of the present invention, the patterned planarized Pre-Metal Dielectric (PMD) layers 22a, 22b, 22c and 22c are preferably: (1) formed of a blanket conformal Pre-Metal Dielectric (PMD) formed of a silicon oxide deposited through a Plasma Enhanced Chemical Vapor Deposition (PECVD) method, (2) planarized through a Chemical Mechanical Polish (CMP) planarizing method, and (3) patterned through a Reactive Ion Etch (RIE) etch method, as is common in the art. Other methods and materials may, however, be employed in forming, planarizing and patterning the patterned planarized Pre-Metal Dielectric (PMD) layers 22a, 22b, 22c and 22d. The patterned planarized Pre-Metal Dielectric (PMD) layers 22a, 22b, 22c and 22d are patterned until there is formed three separate apertures which reach, individually, the surfaces of the source/drain electrodes 20a and 20b, and the patterned tungsten silicide layer 18a of the tungsten silicide polycide gate electrode. Typically, the patterned planarized Pre-Metal Dielectric (PMD) layers 22a, 22b, 22c and 22b are from about 1000 to about 10000 angstroms thick each.

Also shown in FIG. 3 is the presence of the conductive contact studs 24a, 24b and 24c formed into the three apertures adjoining the patterned planarized Pre-Metal Dielectric (PMD) layers 22a, 22b, 22c and 22d, and making contact, respectively, with the source/drain electrode 20a, the patterned tungsten silicide layer 18a of the tungsten silicide polycide gate electrode and the source/drain electrode 20b. Methods and materials through which conductive contact studs may be formed within integrated circuits are known in the art. Conductive contact studs may be formed through methods including but not limited to thermal evaporation methods, electron beam assisted evaporation methods, Chemical Vapor Deposition (CVD) methods and Physical Vapor Deposition (PVD) sputtering methods through which are formed conductive contact studs of conductive materials including but not limited to metals, metal alloys and highly doped polysilicon.

For the preferred embodiment of the method of the present invention, the conductive contact studs 24a, 24b and 24c are preferably formed at least in part of tungsten metal deposited through a Chemical Vapor Deposition (CVD) method, as is common in the art.

Upon forming the conductive contact studs 24a, 24b and 24c, there is formed through the preferred embodiment of the method of the present invention a tungsten silicide polycide gate electrode of the present invention within a Metal Oxide Semiconductor Field Effect Transistor (MOSFET) within an integrated circuit. The tungsten silicide polycide gate electrode so formed has: (1) a limited susceptibility to diffusion of excess fluorine from the uppermost tungsten silicide layer of the tungsten silicide polycide gate electrode to the polysilicon layer/gate oxide layer interface, thus exhibiting a limited susceptibility to thickening of the gate oxide layer; (2) a limited susceptibility to diffusion of dopants from within the polysilicon layers to the tungsten silicide layer and through the gate oxide layer; and (3) a lower contact resistance of a conductor element onto the tungsten silicide layer.

EXAMPLES 1–3

Upon the surfaces of two semiconductor substrates were formed a three layer Stacked Amorphous Silicon (SAS) multi-layer structure in accord with the preferred embodiments of the present invention. The three blanket amorphous silicon layers within the Stacked Amorphous Silicon (SAS) multi-layer structure were formed at a thickness of about 1000 angstroms each through a Low Pressure Chemical Vapor Deposition (LPCVD) method employing silane as a silicon source material at a deposition temperature of about 550 degrees centigrade and a deposition pressure of about 120 mtorr.

Upon the surface of a third semiconductor substrate was formed a single polysilicon layer of thickness about 3000 angstroms through a Low Pressure Chemical Vapor Deposition (LPCVD) method also employing silane as a silicon source material at a deposition temperature of about 625 degrees centigrade and a deposition pressure of about 180 mtorr.

The three semiconductor substrates were united and a tungsten silicide layer was formed upon each semiconductor substrate to form a tungsten silicide polycide gate electrode structure. Each tungsten silicide layer was about 1000 angstroms thick and each tungsten silicide layer was formed through a Chemical Vapor Deposition (CVD) method employing tungsten hexafluoride and silane as the tungsten and silicon source materials, respectively.

One of semiconductor substrates having the tungsten silicide polycide gate electrode structure formed through the Stacked Amorphous Silicon (SAS) multi-layer structure was then annealed at a temperature of about 900 degrees centigrade for a time period of about 30 minutes. The second semiconductor substrate having the tungsten silicide polycide gate electrode structure formed through the stacked Amorphous Silicon (SAS) multi-layer structure was annealed at a temperature of about 950 degrees centigrade for a time period of about 30 minutes. Finally, the semiconductor substrate having the tungsten silicide polycide gate electrode structure formed through the single polysilicon layer was annealed at a temperature of about 900 degrees centigrade for a time period of about 30 minutes. Each of the preceding annealing processes were undertaken within an inert nitrogen atmosphere at a pressure of about 760 mtorr.

After annealing, the fluorine concentrations were profiled through the polysilicon layers of the tungsten silicide polycide gate electrode structures on the three semiconductor substrates employing Secondary Ion Mass Spectroscopy (SIMS) as the measurement technique. The results of the fluorine concentration profiling through the Secondary Ion Mass Spectroscopy (SIMS) technique are shown within FIG. 4. Within FIG. 4, reference numeral 30 corresponds with the fluorine profile through the polysilicon layers of the tungsten silicide polycide gate electrode structure formed employing the Stacked Amorphous Silicon (SAS) multi-layer structure annealed at about 900 degrees centigrade. Analogously, reference numeral 32 corresponds with the fluorine profile through the polysilicon layers of the tungsten silicide polycide gate electrode structure formed employing the Stacked Amorphous Silicon (SAS) multi-layer structure annealed at about 950 degrees centigrade. Finally, reference numeral 34 corresponds with the fluorine profile through the polysilicon layer of the tungsten silicide polycide gate electrode structure formed employing the single polysilicon layer annealed at about 900 degrees centigrade.

The two peaks at about 0.10 microns and 0.20 microns in the curves corresponding to reference numeral 30 and reference numeral 32 correspond respectively with: (1) the interface of the uppermost polysilicon layer with the middle polysilicon layer formed through annealing the Stacked Amorphous Silicon (SAS) multilayer structure, and (2) the interface of the middle polysilicon layer with the lower polysilicon layer formed through annealing the Stacked Amorphous Silicon (SAS) multi-layer structure. The peak at about 0.30 microns in all three curves corresponds with the interface between the lower polysilicon layer of the tungsten silicide polycide gate electrode structures and the semiconductor substrates.

Figure 4:
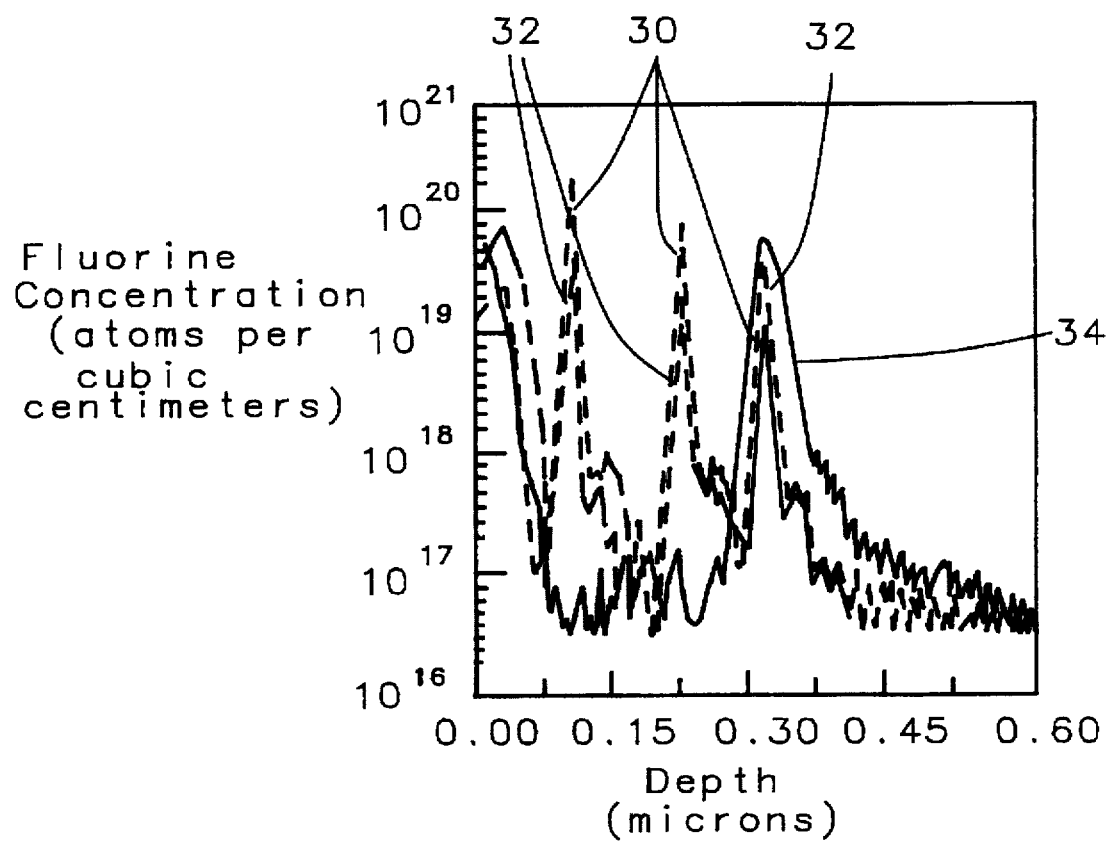
FIG. 4 shows a graph of Fluorine Concentration versus Depth for fluorine within the polysilicon portion of a tungsten silicide polycide gate electrode structure formed in accord with the preferred embodiments of the method of the present invention.

As is seen from the data of FIG. 4, a tungsten silicide polycide gate electrode structure formed employing a Stacked Amorphous Silicon (SAS) multi-layer structure annealed at a temperature in the range of about 900 to about 950 degrees centigrade provides a greater barrier to fluorine diffusion than a tungsten silicide polycide gate electrode structure formed employing a single polysilicon layer of equivalent thickness to the Stacked Amorphous Silicon (SAS) multi-layer structure annealed within the same temperature range. Diffusion of the fluorine atoms is apparently substantially impeded at the interfaces of the polysilicon layers which are formed from annealing the Stacked Amorphous Silicon (SAS) multi-layer structure. By analogy, redistribution of dopants by diffusion from within the polysilicon layers of the tungsten silicide polycide gate electrodes formed through annealing Stacked Amorphous Silicon (SAS) multi-layer structures would also be expected to be diminished at the same interfaces of polysilicon layers.

EXAMPLES 4–5

Upon the surface of a fourth semiconductor substrate was formed a three layer Stacked Amorphous Silicon (SAS) multi-layer structure in accord with the preferred embodiment of the present invention. Each of the three amorphous silicon layers within the Stacked Amorphous Silicon (SAS) multi-layer structure was about 500 angstroms thick, and each of the amorphous silicon layers was formed through a Low Pressure Chemical Vapor Deposition (CVD) method employing silane as the silicon source material at a deposition temperature of about 500 degrees centigrade and a deposition pressure of about 110 mtorr.

Upon the surface of a fifth semiconductor substrate was formed a single polysilicon layer of thickness about 1500 angstroms, approximately equal to the total thickness of the three amorphous silicon layers within the Stacked Amorphous Silicon (SAS) multi-layer structure formed upon the fourth semiconductor substrate. The single polysilicon layer was formed through a Low Pressure Chemical Vapor Deposition (LPCVD) method employing silane as a silicon source material at a deposition temperature of about 625 degrees centigrade and a deposition pressure of about 180 mtorr.

The fourth and fifth semiconductor substrate were united and simultaneously annealed at a temperature of about 875 degrees centigrade for a time period of about 60 minutes in a nitrogen inert atmosphere at a pressure of about 760 mtorr. Through this annealing, the three amorphous silicon layers within the Stacked Amorphous Silicon (SAS) multi-layer structure were crystallized into polysilicon layers. The crystallite size of the polysilicon layers formed upon the fourth semiconductor substrate and the fifth semiconductor substrate were then measured with the aid of Scanning Electron Microscopy (SEM). The crystallite size within the polysilicon layers formed through annealing the Stacked Amorphous Silicon (SAS) multi-layer structure upon the fourth semiconductor substrate was about 0.03 to about 0.1 microns each. The crystallite size within the polysilicon layer formed through annealing of the single polysilicon layer formed upon the fifth semiconductor substrate was about 0.05 to about 0.2 microns. Due to the substantially smaller crystallite size of the polysilicon layers formed through annealing the Stacked Amorphous Silicon (SAS) multi-layer structure, tungsten silicide layers when formed upon the surfaces of those smaller crystallite sized polysilicon layers will have lower contact resistance. The lower contact resistance is desirable when contacting advanced tungsten silicide polycide gate electrodes of limited dimension.

EXAMPLES 6-7

Upon the surfaces of a sixth semiconductor substrate and a seventh semiconductor substrate were formed equivalent standard gate oxide layers. Upon the standard gate oxide layer formed upon the sixth semiconductor substrate was formed a tungsten silicide-Stacked Amorphous Silicon (SAS) multi-layer structure in accord with the preferred embodiments of the method of the present invention. The tungsten silicide-Stacked Amorphous Silicon (SAS) multi-layer structure consisted of a first amorphous silicon layer formed upon the standard gate oxide layer at a thickness of about 300 angstroms, a second amorphous silicon layer formed upon the first amorphous silicon layer at a thickness of about 300 angstroms, a third amorphous silicon layer formed upon the second amorphous silicon layer at a thickness of about 400 angstroms and a tungsten silicide layer formed upon the third amorphous silicon layer at a thickness of about 1000 angstroms.

Upon the standard gate oxide layer formed upon the seventh semiconductor substrate was formed a tungsten silicide-amorphous silicon single layer structure. The tungsten silicide-amorphous silicon single layer structure consisted of an amorphous silicon layer of thickness about 1000 angstroms formed upon the standard gate oxide layer and a tungsten silicide layer of thickness about 1000 angstroms formed upon the amorphous silicon single layer.

The sixth semiconductor substrate and the seventh semiconductor substrate were then reunited and simultaneously annealed in an inert nitrogen atmosphere at a temperature of about 875 degrees centigrade for a time period of 60 minutes to form a pair of tungsten silicide polycide gate electrodes.

The capacitance characteristics of the pair of tungsten silicide polycide gate electrodes were then determined as a function of applied voltage at a frequency of 100 kHz. A graph of the recorded data is shown in FIG. 5, where reference numeral 40 corresponds to the Capacitance versus Voltage characteristics of the tungsten silicide polycide gate electrode formed through annealing the tungsten silicide-Stacked Amorphous Silicon (SAS) multi-layer structure upon standard gate oxide layer formed upon the sixth semiconductor substrate and reference numeral 42 corresponds to the Capacitance versus Voltage characteristics of the tungsten silicide polycide gate electrode formed through annealing the tungsten silicide-amorphous silicon single layer structure upon the standard gate oxide layer formed upon the seventh semiconductor substrate.

Figure 5:
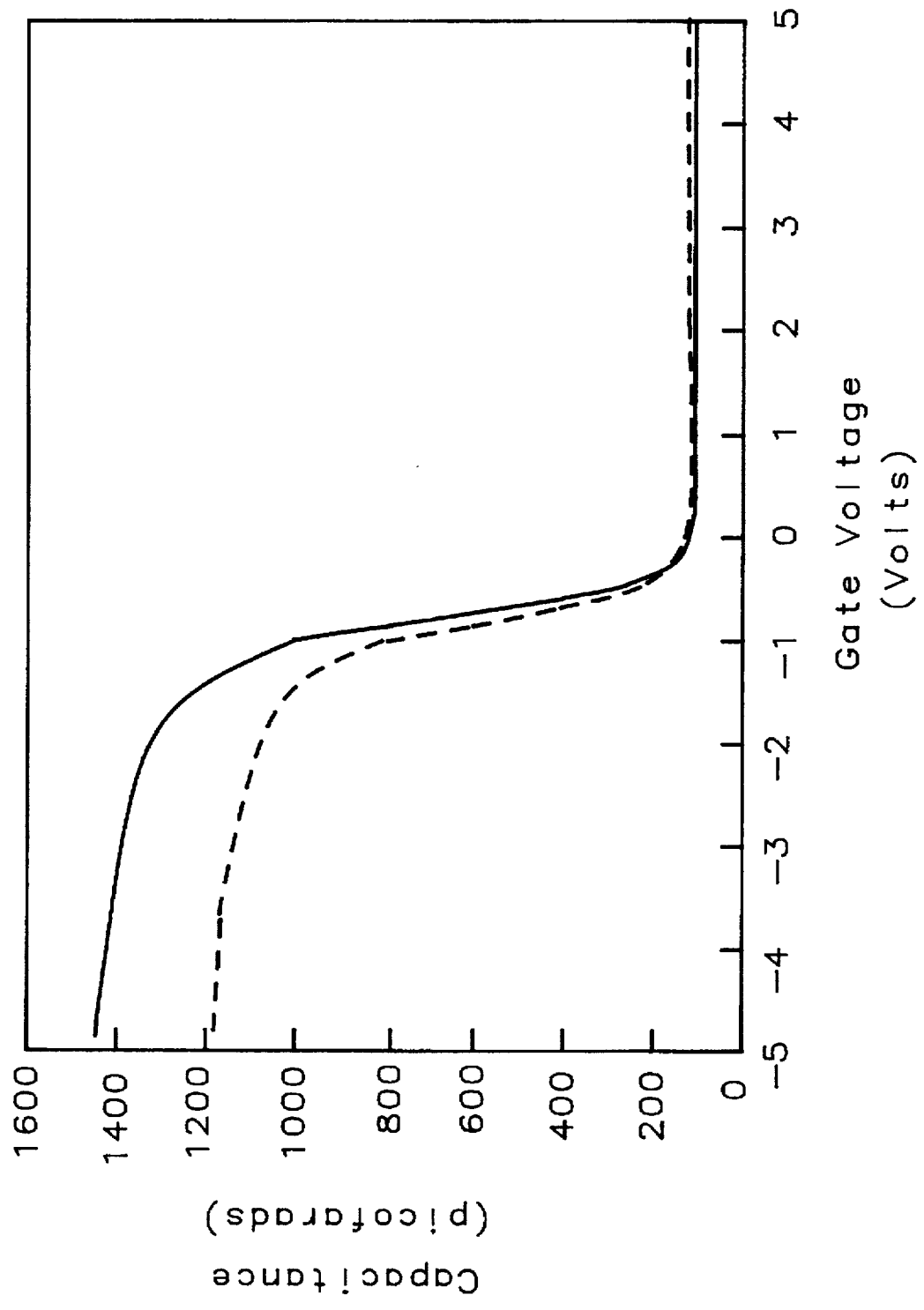
FIG. 5 shows a graph of Capacitance versus Gate Voltage for tungsten silicide polycide gate electrodes formed through either annealing a Stacked Amorphous Silicon (SAS) multi-layer structure in accord with the preferred embodiments of the method of the present invention or annealing an otherwise equivalent amorphous silicon single layer structure.

As is seen from the graph of FIG. 5, the tungsten silicide polycide gate electrode formed through annealing the tungsten silicide-Stacked Amorphous Silicon (SAS) multi-layer structure exhibits a desirable higher level of capacitance than the otherwise equivalent tungsten silicide polycide gate electrode formed through annealing the tungsten silicide-amorphous silicon single layer structure.

As is understood by a person skilled in the art, the preferred embodiments and EXAMPLES of the present invention are representative of the present invention rather than limiting of the present invention. Revisions may be made to methods, materials, structures and dimensions through which are formed the preferred embodiments and EXAMPLES of the present invention while still forming embodiments and EXAMPLES which are within the spirit and scope of the present invention.

What is claimed is:

1. A method for forming a tungsten silicide polycide gate electrode within a Metal Oxide Semiconductor Field Effect Transistor (MOSFET) comprising:

forming upon a semiconductor substrate a gate oxide layer;

forming upon the gate oxide layer a first polysilicon layer through annealing a first amorphous silicon layer;

forming upon the first polysilicon layer a second polysilicon layer through annealing a second amorphous silicon layer;

forming upon the second polysilicon layer a tungsten silicide layer through a Chemical Vapor Deposition method, wherein the first polysilicon layer and the second polysilicon layer each have a crystallite size of no greater than about 0.3 microns, and the first polysilicon layer and the second polysilicon layer each have a dopant concentration of larger than about 1E16 atoms per cubic centimeter.

2. The method of claim 1 wherein the thickness of the gate oxide layer is from about 30 to about 200 angstroms.

3. The method of claim 1 wherein the thickness of the first polysilicon layer and the second polysilicon layer is from about 200 to about 2000 angstroms each.

4. The method of claim 1 wherein the first amorphous silicon layer and the second amorphous silicon layer are formed through a Low Pressure Chemical Vapor Deposition (LPCVD) method employing silane as a silicon source material.

5. The method of claim 1 wherein the first amorphous silicon layer and the second amorphous silicon layer are annealed at a temperature of from about 700 to about 950 degrees centigrade for a time period of from about 10 to about 100 minutes in an inert atmosphere.

6. The method of claim 5 wherein the inert atmosphere is a nitrogen inert atmosphere at a pressure of about 200 to about 760 mtorr.

7. The method of claim 1 wherein the first amorphous silicon layer and the second amorphous silicon layer are annealed sequentially to form the first polysilicon layer and the second polysilicon layer, respectively.

8. The method of claim 1 wherein the first amorphous silicon layer and the second amorphous silicon layer are annealed concurrently to form the first polysilicon layer and the second polysilicon layer, respectively.

9. The method of claim 1 wherein the thickness of the tungsten silicide layer is from about 100 to about 2000 angstroms.

10. The method of claim 1 wherein the tungsten silicide layer is formed through a Chemical Vapor Deposition (CVD) co-deposition method employing tungsten hexafluoride and a silicon source material chosen from the group of silicon source materials consisting of silane and dichlorosilane.

11. The method of claim 1 further comprising forming at least a third polysilicon layer through annealing at least a third amorphous silicon layer, the third polysilicon layer and any additional polysilicon layers so formed residing between the second polysilicon layer and the tungsten silicide layer, the third polysilicon layer and any additional polysilicon layers each having a crystallite size no greater than about 0.3 microns, a dopant concentration larger than about 1E16 atoms per cubic centimeter and a thickness of from about 200 to about 2000 angstroms.

12. The method of claim 1 further comprising forming a fourth amorphous silicon layer directly beneath the tungsten silicide layer, the fourth amorphous silicon layer having a dopant concentration of larger than about 1E16 atoms per cubic centimeter and a thickness of from about 200 to about 2000 angstroms.

13. The method of claim 1 further comprising forming a pair of source/drain electrodes adjoining a pair of opposite edges of the first polysilicon layer, the second polysilicon layer and the tungsten silicide layer, thus forming a Metal Oxide Semiconductor Field Effect Transistor (MOSFET).

14. The method of claim 13 further comprising forming at least a patterned first insulator layer and a patterned conductor layer upon the Metal Oxide Semiconductor Field Effect Transistor (MOSFET), thus forming the Metal Oxide Semiconductor Field Effect Transistor (MOSFET) within an integrated circuit.

15. A gate electrode within a Metal Oxide Semiconductor Field Effect Transistor (MOSFET) comprising:

a semiconductor substrate having a gate oxide layer formed thereupon;

a first polysilicon layer formed upon the gate oxide layer;

a second polysilicon layer formed upon the first polysilicon layer; and, a tungsten silicide layer formed through a Chemical Vapor Deposition (CVD) method upon the second polysilicon layer, wherein the first polysilicon layer and the second polysilicon layer each have a crystallite size of no greater than about 0.3 microns and the first polysilicon layer and the second polysilicon layer each have a dopant concentration of larger than about 1E16 atoms per cubic centimeter.

16. The gate electrode of claim 15 wherein the thickness of the gate oxide layer is from about 30 to about 200 angstroms.

17. The gate electrode of claim 15 wherein the thickness of the first polysilicon layer and the second polysilicon layer is from about 200 to about 2000 angstroms each.

18. The gate electrode of claim 15 wherein the thickness of the tungsten silicide layer is from about 100 to about 2000 angstroms.

19. The gate electrode of claim 15 further comprising at least a third polysilicon layer between the second polysilicon layer and the tungsten silicide layer, the third polysilicon layer and any additional polysilicon layers having a crystallite size of no greater than about 0.3 microns, a dopant concentration of larger than about 1E16 atoms per cubic centimeter and a thickness of from about 200 to about 2000 angstroms.

20. The gate electrode of claim 15 further comprising an amorphous silicon layer directly beneath the tungsten silicide layer, the amorphous silicon layer having a dopant concentration of larger than about 1E16 atoms per cubic centimeter and a thickness of from about 200 to about 2000 angstroms.

21. The gate electrode of claim 15 further comprising a pair of source/drain electrodes within the semiconductor substrate adjoining a pair of opposite edges of the first polysilicon layer, the second polysilicon layer and the tungsten silicide layer, thus yielding a Metal Oxide Semiconductor Field Effect Transistor (MOSFET).

22. The gate electrode of claim 21 further comprising at least a patterned first insulator layer and a patterned conductor layer upon the Metal Oxide Semiconductor Field Effect Transistor (MOSFET), thus yielding the Metal Oxide Semiconductor Field Effect Transistor (MOSFET) within an integrated circuit.

* * * * *